United States Patent [19]

Sakai

[11] Patent Number: 5,565,383
[45] Date of Patent: Oct. 15, 1996

[54] METHOD FOR SELECTIVE FORMATION OF SILICIDE FILMS WITHOUT FORMATION ON VERTICAL GATE SIDEWALLS USING COLLIMATED SPUTTERING

[75] Inventor: Isami Sakai, Tokyo, Japan

[73] Assignee: NEC Corporation, Tokyo, Japan

[21] Appl. No.: 586,422

[22] Filed: Jan. 16, 1996

Related U.S. Application Data

[63] Continuation of Ser. No. 353,349, Dec. 5, 1994, abandoned.

[30] Foreign Application Priority Data

Dec. 3, 1993 [JP] Japan .................................. 5-303754

[51] Int. Cl.⁶ .................................................. H01L 21/28
[52] U.S. Cl. ...................... 437/200; 437/193; 437/201; 204/192.17
[58] Field of Search .................................. 437/192, 193, 437/200, 201; 257/755, 757, 770, 377; 204/192.17

[56] References Cited

U.S. PATENT DOCUMENTS

| | | | |
|---|---|---|---|
| 4,660,276 | 4/1987 | Hsu .......................................... | 437/200 |
| 5,070,038 | 12/1991 | Jin ............................................ | 437/200 |
| 5,262,354 | 11/1993 | Cote et al. ................................ | 437/195 |
| 5,300,813 | 4/1994 | Joshi et al. .............................. | 257/752 |
| 5,401,675 | 3/1995 | Lee et al. ................................ | 437/192 |
| 5,426,330 | 6/1995 | Joshi et al. .............................. | 257/752 |

FOREIGN PATENT DOCUMENTS

| | | |
|---|---|---|
| 57-99775 | 6/1982 | Japan . |
| 59-161023 | 9/1984 | Japan . |

OTHER PUBLICATIONS

S. Wolf, "Silicon Processing for the VLSI Era, vol. 2: Process Integration", pp. 144, 145, 147, 148, Lattice Press, (1990).

Primary Examiner—George Fourson
Assistant Examiner—Thomas G. Bilodeau
Attorney, Agent, or Firm—Young & Thompson

[57] ABSTRACT

In a method for forming silicide films on a silicon substrate being formed thereon with a gate surrounded by gate side walls and being formed therein with diffusion regions, the silicide film being formed on a predetermined region of the silicon substrate at least except for an extremely thin film on the gate side walls. The method comprises the following steps. The silicon substrate is subjected to a collimated sputtering of metal atoms with use of a meshed mask on the silicon substrate surface to deposit a metal film on an entire surface of the silicon substrate, except for an extremely thin film on the vertical walls. The deposited metal film is further subjected to a heat treatment to react the metal film with the diffusion regions to thereby selectively form a metal silicide film at least on the diffusion regions, except for an extremely thin film on the vertical walls.

7 Claims, 3 Drawing Sheets

METHOD FOR SELECTIVE FORMATION OF SILICIDE FILMS WITHOUT FORMATION ON VERTICAL GATE SIDEWALLS USING COLLIMATED SPUTTERING

This application is a continuation of application Ser. No. 08/353,349, filed Dec. 5, 1994, now abandoned.

BACKGROUND OF THE INVENTION

1. Field of the Invention

The invention relates to a method for fabricating a semiconductor device, and more particularly to a method for a selective formation of silicide films in a MOS field effect transistor.

2. Description of the Related Art

In the prior arts, it has been known to form silicide gate, source and drain electrodes by use of self-alignment technique on a MOS field effect transistor. A conventional fabrication method for a MOS field effect transistor with silicide gate, silicide source and silicide drain will hereinafter be described with reference to FIGS. 1A to 1C.

With reference to FIG. 1A, a field oxide film 102 is formed on a passive region of a p-type silicon substrate 101, while a gate oxide film 103 is formed on an active region of the p-type silicon substrate 101. A phosphorus-doped polysilicon film 104 is selectively formed on predetermined regions of the gate oxide film 103. An n-type impurity is implanted into an upper region of the silicon substrate 101 by a self-alignment technique with use of the phosphorus-doped polysilicon film as a mask to thereby form $n^-$-type diffusion regions 105 in the upper region of the silicon substrate 101. A silicon oxide film having a thickness of 2000 angstroms is grown by a chemical vapor deposition on an entire surface of the device to subsequently be etched by anisotropic etching to form side wall oxide films having a thickness of 2000 angstroms at opposite sides of the individual polysilicon films 104. An ion-implantation of arsenic into the upper region of the p-type silicon substrate 101 is carried out by a self-alignment technique with use of the polysilicon films 104 and the side wall oxide films 106 as masks to thereby form $n^+$-type diffusion regions 107 serving as source and drain regions.

With reference to FIG. 1B, a spontaneous oxide film is removed by a buffered fluorine acid before a titanium layer 201 having a thickness of 1000 angstroms is formed by sputtering on an entire surface of the device.

With reference to FIG. 1C, the sputtered titanium layer 201 is subjected to a heat treatment in a nitrogen atmosphere so that the titanium layer 201 is partially reacted to the polysilicon film 104 and to the $n^+$-type diffusion regions 107 to thereby form titanium silicide layers 109 and 202 in an upper region of each of the polysilicon films 104 and in an upper region of each of the $n^+$-type diffusion regions 107. In this heat treatment, the titanium layer 201 is also reacted to the side wall oxide films 106 thereby thin titanium silicide films 401 are formed on the side wall oxide films 106. The thin titanium silicide films 401 are formed to be contact with the titanium silicide films 109 and 202 on the $n^+$-type diffusion regions 107. The unreacted titanium layer 201 remaining on the field oxide film 102 is removed by a wet etching.

Subsequently, an inter-layer insulator not illustrated is formed on an entire surface of the device and then contact holes are formed in the inter-layer insulator before aluminium electrodes.

The above described fabrication method is disclosed in the Japanese laid-open patent application No. 57-99775.

According to the conventional method as described above, the titanium layer 201 is forced to be reacted by the heat treatment to the side wall oxide films 106 thereby thin titanium silicide films 401 are formed on the side wall oxide films 106. The thin titanium silicide films 401 are formed to be electrically in contact with the titanium silicide films 109 and 202 on the $n^+$-type diffusion regions 107. The thin titanium silicide films 401 on the side wall oxide films 106 electrically connected to the titanium silicide layers 109 and 202 is no longer capable of permitting the transistor to show the normal operation.

To solve the above problem, it is required to remove the thin titanium silicide films 401 formed on the side wall oxide films 106. Actually, when removing the thin titanium silicide films 401 on the side wall oxide films 106, it is difficult to remove the thin titanium silicide films 401 only, and therefore not only the thin titanium silicide films 401 on the side wall oxide films 106 but also the titanium silicide films 109 and 202 are removed. Namely, a thickness of the titanium silicide films 109 and 202 is reduced thereby a sheet resistance is increased. The resulting value of the sheet resistance is made valuable thereby resulting in a difficulty of the transistor in showing the necessary performances. As a result, a yield of the transistor is also reduced.

To settle the above problem, there is a way to form silicon nitride side wall films on which the titanium silicide film is hard to be formed. Notwithstanding, the silicon nitride film has a large density of the trap center for carriers. For example, hot electrons generated at an end of the drain region are readily trapped into the silicon nitride film having the large trap center density. The trapped electrons in the silicon nitride side wall film may cause an increase of a sheet resistance of the lightly doped $n^-$-type diffusion region 105 thereby resulting in a considerable deterioration of the performance of the MOS transistor. This may result in a lowering of the reliability of the MOS transistor.

By a scaling down of the device size, a distance between the polysilicon films 104 is also reduced thereby resulting in a deterioration of the step coverage of the titanium silicide film 202 formed by spattering between the polysilicon films 104 serving as gates. The deterioration of the step coverage of the titanium silicide film 202 may provide a reduction of a thickness of the titanium silicide film 202 formed by spattering. The reduction of the thickness of the titanium silicide film 202 may provide an increase of a sheet resistance of the titanium silicide film 202 and a deterioration of a heat resistivity thereof.

SUMMARY OF THE INVENTION

Accordingly, it is a primary object of the present invention to provide a novel method for fabricating a MOS field effect transistor to be free from any of the problems as described above.

It is a further object of the present invention to provide a novel method for fabricating a MOS field effect transistor to substantially suppress a formation of thin titanium silicide films on gate side walls.

It is a furthermore object of the present invention to provide a novel method for fabricating a MOS field effect transistor to be free from the problem with deterioration of the step coverage of the titanium silicide film between gate electrodes.

The above and other objects, features and advantages of the present invention will be apparent from the following descriptions.

The invention provides a method for forming silicide films on a silicon substrate being formed thereon with a gate surrounded by gate side walls and being formed therein with diffusion regions. The silicide film being formed on a predetermined region of the silicon substrate at least except for an extremely thin film on the gate side walls. The method comprises the following steps. The silicon substrate is subjected to a collimated sputtering of metal atoms with use of a meshed mask on the silicon substrate surface to deposit a metal film on an entire surface of the silicon substrate, except for an extremely thin film on the vertical walls. The deposited metal film is further subjected to a heat treatment to react the metal film with the diffusion regions to thereby selectively form a metal silicide film at least on the diffusion regions, except for an extremely thin film on the vertical walls.

The invention also provides a method of forming a silicide film on a silicon substrate with vertical walls in a predetermined region of the silicon substrate at least except for an extremely thin film on the vertical walls. The method comprises the following steps. The silicon substrate is subjected to a collimated sputtering of metal atoms with use of a meshed mask on the silicon substrate surface to deposit a metal film on an entire surface of the silicon substrate, except for an extremely thin film on the vertical walls. The deposited metal film is further subjected to a heat treatment to react the metal film with the silicon substrate to thereby selectively form a metal silicide film on the predetermined region of the silicon substrate surface, at least except for an extremely thin film on the vertical walls.

BRIEF DESCRIPTIONS OF THE DRAWINGS

Preferred embodiments of the present invention will hereinafter fully be described in detail with reference to the accompanying drawings.

PREFERRED EMBODIMENTS OF THE PRESENT INVENTION

A first embodiment according to the present invention will be described in detail with reference to FIGS. 2A to 2C in which a novel fabrication method of a MOS field effect transistor with silicide gate, silicide source and silicide drain.

Figure 1A:
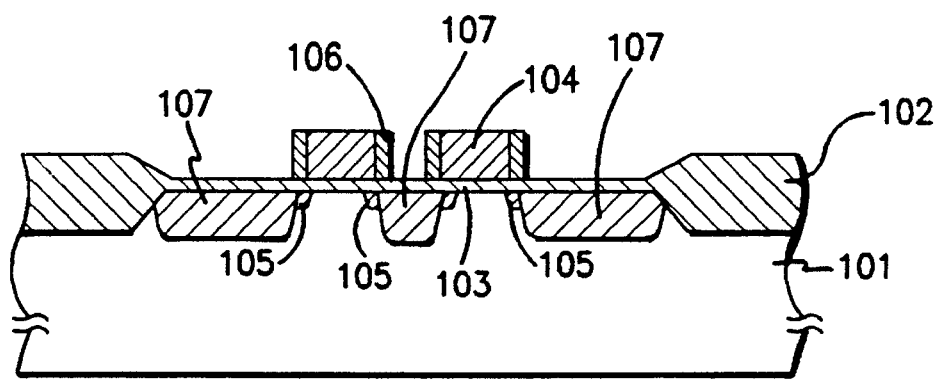
FIGS. 1A to 1C are fragmentary cross sectional elevation views illustrative of the conventional processes involved in the fabrication method of the MOS field effect transistor with the titanium silicide films.
Figure 1B:
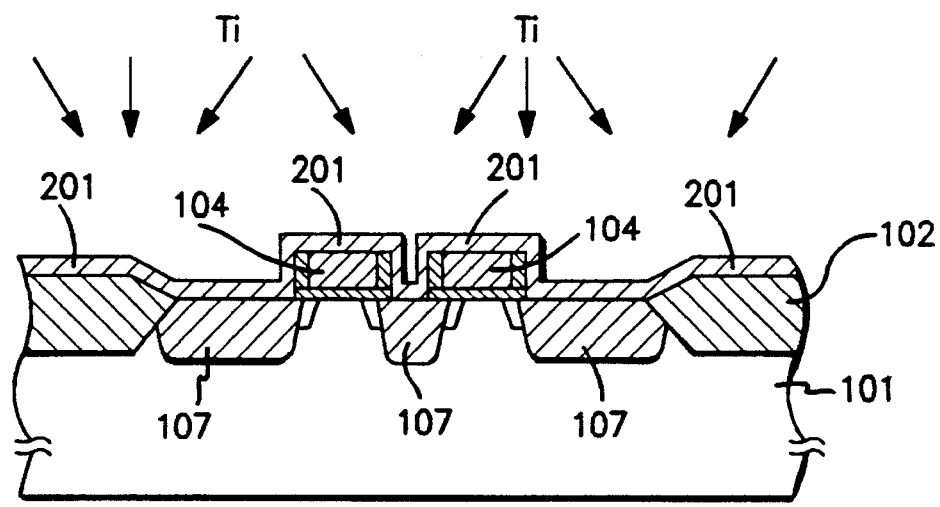
Figure 1C:
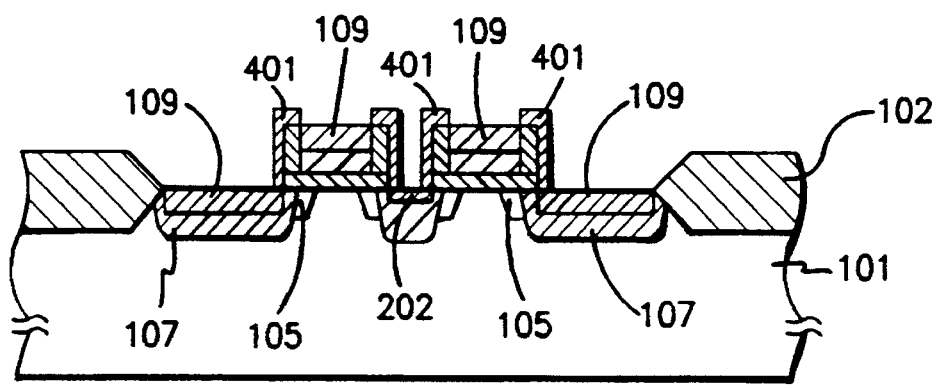
Figure 2A:
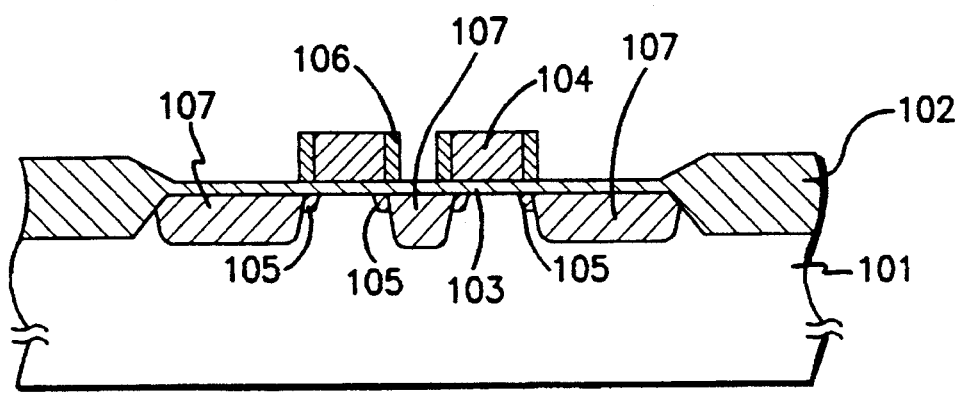
FIGS. 2A to 2C are fragmentary cross sectional elevation views illustrative of novel processes involved in the fabrication method of the MOS field effect transistor with the titanium silicide films in a first embodiment according to the present invention.

With reference to FIG. 2A, a field oxide film 102 is formed on a passive region of a p-type silicon substrate 101, while a gate oxide film 103 is formed on an active region of the p-type silicon substrate 101. A phosphorus-doped polysilicon film 104 having a thickness of 2000 angstroms is selectively formed on predetermined regions of the gate oxide film 103. An n-type impurity is implanted into an upper region of the silicon substrate 101 by a self-alignment technique with use of the phosphorus-doped polysilicon film as a mask to thereby form $n^-$-type diffusion regions 105 in the upper region of the silicon substrate 101. A silicon oxide film having a thickness of 2000 angstroms is grown by a chemical vapor deposition on an entire surface of the device to subsequently be etched by anisotropic etching to form side wall oxide films having a thickness of 2000 angstroms at opposite sides of the individual polysilicon films 104. An ion-implantation of arsenic into the upper region of the p-type silicon substrate 101 is carried out by a self-alignment technique with use of the polysilicon films 104 and the side wall oxide films 106 as masks for subsequent heat treatment at a temperature of 850° C. to cause a diffusion of the implanted arsenic impurity to thereby form $n^+$-type diffusion regions 107 serving as source and drain regions.

Figure 2B:
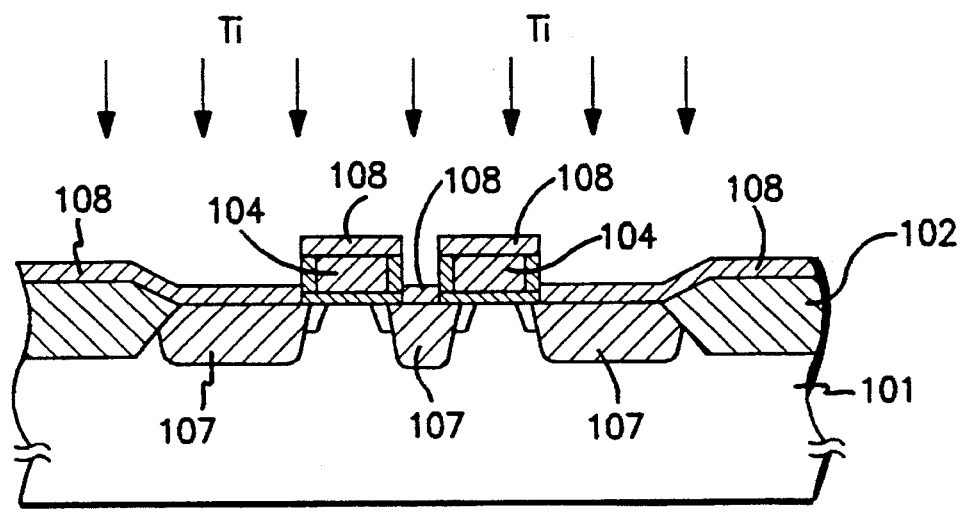

With reference to FIG. 2B, spontaneous oxide films both on the polysilicon films 106 and on the $n^+$-type diffusion regions 107 are removed by a buffered fluorine acid before a collimated sputtering method is carried out to form a titanium layer 108 having a thickness of 500 angstroms on an entire surface of the device, except for an extremely thin film on the vertical side walls at opposite sides of each of the polysilicon films 104 serving as the gates. In the collimated sputtering method, a meshed mask is placed between a target in a sputtering equipment and a surface of the device so that titanium atoms sputtered from the target are filtered by the mesh mask. As a result, only the sputtered titanium atoms having a vertical-to-surface direction component may pass through the meshed mask to be deposited on the surface of the device, while sputtered titanium atoms having a substantial oblique direction component are captured by the meshed mask without reaching to the surface of the device. For that reason, only the sputtered titanium atoms having the vertical-to-surface direction component are deposited on the device surface, except for an extremely thin film the vertical side walls.

Figure 2C:
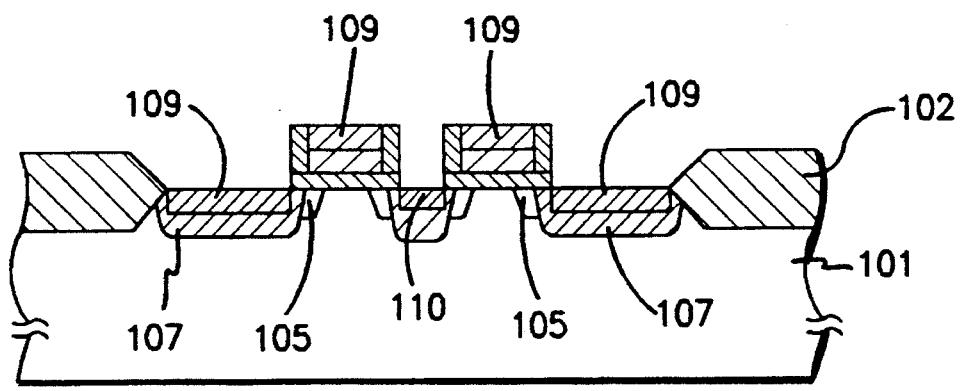

With reference to FIG. 2C, the sputtered titanium layer 108 is subjected to a heat treatment in a nitrogen atmosphere so that the titanium layer 108 is partially reacted to the polysilicon film 104 and to the $n^+$-type diffusion regions 107 to thereby form titanium silicide layers 109 and 110 in an upper region of each of the gate polysilicon films 104 and in an upper region of each of the $n^+$-type diffusion regions 107. The titanium silicide layers 109 and 110 have a thickness of 500 angstroms. In this heat treatment, since substantially no titanium layer is formed on any of the vertical side walls, the gate side wall oxide films 106 is hardly capable of reacting to titanium atoms. Hence, substantially no titanium silicide film is formed on any of the gate side walls. Substantially none of the thin titanium silicide films are made to contact with the titanium silicide films 109 and 110. The unreacted titanium layer 108 remaining on the field oxide film 102 is removed by a wet etching with use of a mixture liquid of aqueous ammonia with aqueous hydrogen peroxide.

Subsequently, an inter-layer insulator not illustrated is formed on an entire surface of the device and then contact holes are formed in the inter-layer insulator before aluminium electrodes are formed.

According to the novel method as described above, the collimated sputtering deposition of titanium atoms on the surface of the device permits substantially no titanium layer to be deposited on the gate side walls 106 so that substantially no titanium atoms are reacted by the heat treatment to the side wall oxide films 106, and thereby substantially no thin titanium silicide film is formed on the side wall oxide films 106. The use of the collimated sputtering deposition method permits substantially no formation of any thin titanium silicide film to be electrically in contact with the titanium silicide films 109 and 110 on the n$^+$-type diffusion regions 107. This may permit the transistor to show excellent performances.

Unlike the conventional fabrication method, the use of the collimated sputtering deposition of titanium atoms on the device surface alleviates the problem relative to the requirement to remove any thin titanium silicide film formed on the side wall oxide film. Hence, a thickness of the titanium silicide film is kept and thereby a sheet resistance is not increased. The resultant value of the sheet resistance of the titanium silicide film is made uniform thereby resulting in a facilitation of the transistor excellent performances. As a result, a yield of the transistor is also improved from 70% to almost 100%.

By a scaling down of the device size, a distance between the polysilicon films 104 is also reduced. However, the use of the collimated sputtering deposition method improves the step coverage of the titanium silicide film 110 between the polysilicon films 104 serving as gates. The improvement of the step coverage of the titanium silicide film 110 ensures that the necessary thickness of the titanium silicide film 110 is formed by the collimated sputtering deposition; and thereby any increase of the sheet resistance of the titanium silicide film 110 is prevented and any deterioration of a heat resistivity thereof is also prevented.

A second embodiment according to the present invention will be described in detail with reference to FIGS. 3A to 3C in which a novel fabrication method of a MOS field effect transistor with silicide gate, silicide source and silicide drain.

Figure 3A:
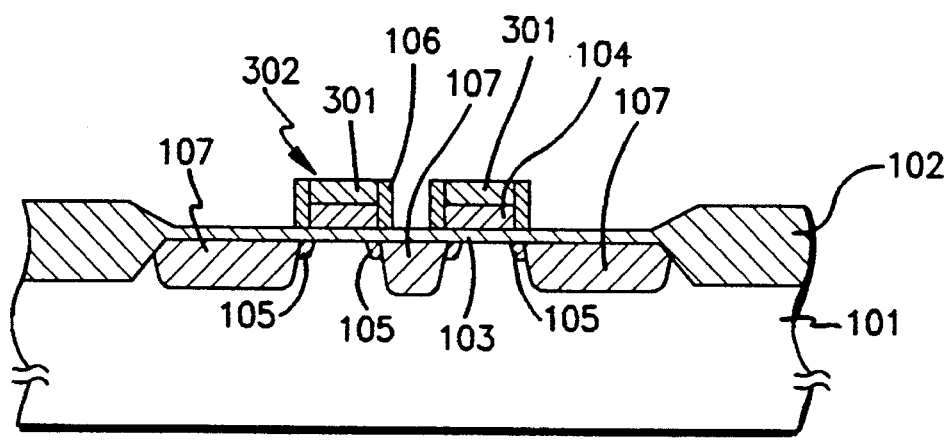
FIGS. 3A to 3C are fragmentary cross sectional elevation views illustrative of novel processes involved in the fabrication method of the MOS field effect transistor with the titanium silicide films in a second embodiment according to the present invention.

With reference to FIG. 3A, a field oxide film 102 is formed on a passive region of a p-type silicon substrate 101, while a gate oxide film 103 is formed on an active region of the p-type silicon substrate 101. A lamination of a phosphorus-doped polysilicon film 104 and a tungsten silicide 301 is selectively formed on predetermined regions of the gate oxide film 103. An n-type impurity is implanted into an upper region of the silicon substrate 101 by a self-alignment technique with use of the laminated polysilicon tungsten silicide films 104 and 301 as a mask to thereby form n$^-$-type diffusion regions 105 in the upper region of the silicon substrate 101. A silicon oxide film having a thickness of 2000 angstroms is grown by a chemical vapor deposition on an entire surface of the device to subsequently be etched by anisotropic etching to form side wall oxide films having a thickness of 2000 angstroms at opposite sides of the laminated polysilicon and tungsten silicide films 104. An ion-implantation of arsenic into the upper region of the p-type silicon substrate 101 is carried out by a self-alignment technique with use of the laminated polysilicon and tungsten silicide films 104 and 108 in addition the side wall oxide films 106 as masks for subsequent heat treatment at a temperature of 850° C. to cause a diffusion of the implanted arsenic impurity to thereby form n$^+$-type diffusion regions 107 serving as source and drain regions.

Figure 3B:
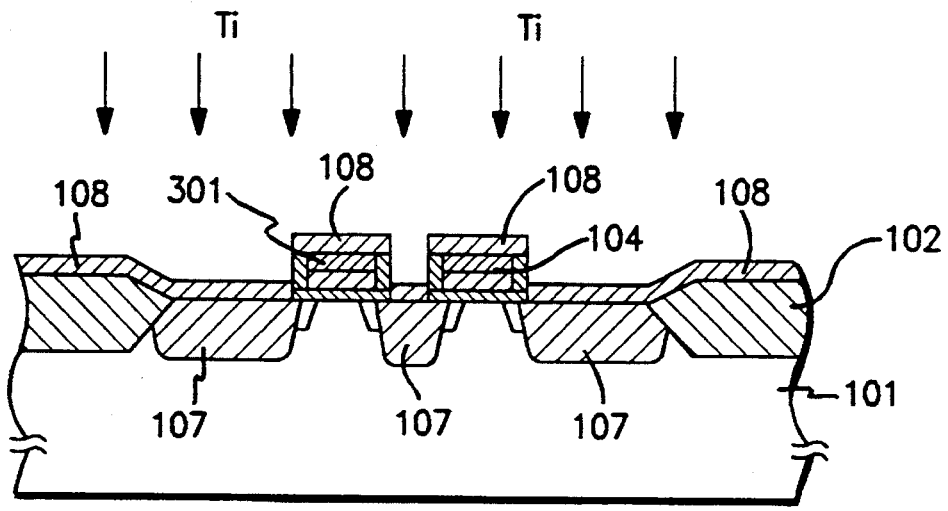

With reference to FIG. 3B, spontaneous oxide films on the n$^+$-type diffusion regions 107 are removed by a buffered fluorine acid before a collimated sputtering method is carried out to form a titanium layer 108 having a thickness of 500 angstroms on an entire surface of the device, except for an extremely thin film of the vertical side walls at opposite sides of each of the laminated polysilicon and tungsten silicide films 104 and 108 serving as the gates. In the collimated sputtering method, a meshed mask is placed between a target in a sputtering equipment and a surface of the device so that titanium atoms sputtered from the target are filtered by the mesh mask. As a result, only the sputtered titanium atoms having a vertical-to-surface direction component may pass through the meshed mask and then be deposited on the surface of the device, while sputtered titanium atoms having any substantial oblique direction component are captured by the meshed mask without reaching to the surface of the device. For that reason, only the sputtered titanium atoms having the vertical-to-surface direction component are able to be deposited on the device surface, except for an extremely thin film on the vertical side walls.

Figure 3C:
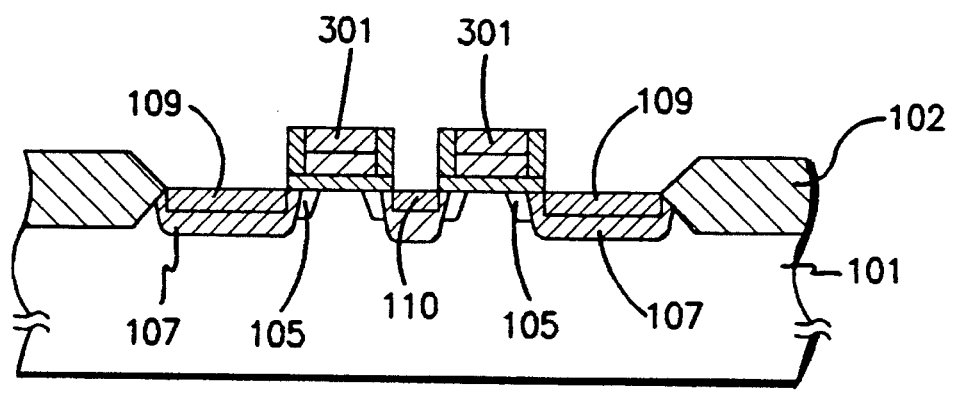

With reference to FIG. 3C, the sputtered titanium layer 108 is subjected to a heat treatment in a nitrogen atmosphere so that the titanium layer 108 is partially reacted to the n$^+$-type diffusion regions 107 to thereby form titanium silicide layers 109 and 110 in an upper region of each of the n$^+$-type diffusion regions 107. The titanium silicide layers 109 and 110 have a thickness of 500 angstroms. In this heat treatment, since substantially no titanium layer has been formed on the vertical side walls, the gate side wall oxide films 106 is absolutely substantially incapable of reacting to titanium atoms. The titanium film 108 on the tungsten silicide 301 is also unable to react to the tungsten silicide. Namely, the unreacted titanium film 108 remains on the tungsten silicide film 301. Hence, substantially no titanium silicide film is formed on any of the gate side walls and on the tungsten silicide film 301. Substantially no thin titanium silicide film in contact with the titanium silicide films 109 and 110 is formed. The unreacted titanium layer 108 remaining on the field oxide film 102 is removed by a wet etching with use of a mixture liquid of aqueous ammonia with aqueous hydrogen peroxide.

Subsequently, an inter-layer insulator not illustrated is formed on an entire surface of the device and then contact holes are formed in the inter-layer insulator before aluminium electrodes.

According to the novel method as described above, the gate comprises the laminated polysilicon film and tungsten silicide film or the tungsten polycide showing an excellent heat resistivity. Further, the collimated sputtering deposition of titanium atoms on the surface of the device may permit allows substantially no titanium layer to be deposited on the gate side walls 106 so that substantially no titanium atoms are reacted by the heat treatment to the side wall oxide films 106, thereby substantially no thin titanium silicide film is formed on the side wall oxide films 106. The use of the collimated sputtering deposition method permits substantially no formation of any thin titanium silicide film electrically in contact with the titanium silicide films 109 and 110 on the n$^+$-type diffusion regions 107. This may permit the transistor to show excellent performances.

Unlike the conventional fabrication method, the use of the collimated sputtering deposition of titanium atoms on the device surface alleviates the problem relative to the requirement to remove any thin titanium silicide film formed on the side wall oxide film. Hence, a thickness of the titanium silicide film is kept thereby a sheet resistance is not increased. The resultant value of the sheet resistance of the titanium silicide film is made uniform thereby resulting in a facilitation of the transistor to show the excellent performances. As a result, a yield of the transistor is also improved from 70% to almost 100%.

By a scaling down of the device size, a distance between the gates is also reduced. However, the use of the collimated sputtering deposition method improves the step coverage of the titanium silicide film 110 between the gates. The improvement of the step coverage of the titanium silicide film 110 ensures that the necessary thickness of the titanium silicide film 110 is formed by the collimated sputtering deposition thereby any increase of the sheet resistance of the titanium silicide film 110 is prevented and any deterioration of a heat resistivity thereof is also prevented.

Whereas in the foregoing embodiments the n-channel transistor is formed, the present invention is of course applicable to the p-channel transistor. In place of titanium silicide, it is also available to use tungsten silicide, cobalt silicide and molybdenum silicide and other high melting point metals.

Whereas modifications of the present invention will no doubt be apparent to a person having ordinarily skill in the art, to which the invention pertains, it is to be understood that embodiments shown and described by way of illustrations are by no means intended to be considered in a limiting sense. Accordingly, it is to be intended to cover by claims any modifications of the present invention which fall within the spirit and scope of the invention.

What is claimed is:

1. A method of forming a silicide film on a silicon substrate being formed thereon with a gate surrounded by vertical gate side walls and being formed therein with diffusion regions, said silicide film being formed on a region of said silicon substrate, said vertical gate side walls being substantially free from a formation of said silicide film thereon, wherein said method comprises the steps of:

subjecting said silicon substrate to a collimated sputtering of metal atoms with use of a meshed mask on said silicon substrate surface to deposit a metal film on an entire surface of said silicon substrate, substantially no metal film being deposited on said vertical walls; and subjecting said deposited metal film to a heat treatment to react said metal film with said diffusion regions to thereby selectively form a metal silicide film at least on said diffusion regions, substantially no metal silicide film being formed on said vertical walls.

2. The method as claimed in claim 1, wherein said metal film is made of a refractory metal.

3. The method as claimed in claim 2, wherein said refractory metal is selected from the group consisting of titanium, molybdenum, and tungsten and cobalt.

4. The method as claimed in claim 1, further comprising the step of removing unreacted metal film substantially after said heat treatment step by a wet etching to leave said metal silicide film substantially only on said silicon substrate.

5. The method as claimed in claim 4, wherein said wet etching uses a mixture liquid of aqueous ammonia with aqueous hydrogen peroxide.

6. The method as claimed in clam 1, wherein said gate comprises an impurity doped polysilicon film.

7. The method as claimed in claim 1, wherein said gate comprises a lamination of an impurity doped polysilicon film and a metal film overlying said polysilicon film.

\* \* \* \* \*